United States Patent
Jeon (10) Patent No.: US 7,940,117 B2
(45) Date of Patent: May 10, 2011

(54) VOLTAGE GENERATION CIRCUIT AND FLASH MEMORY DEVICE INCLUDING THE SAME

(75) Inventor: Hong-Soo Jeon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 12/465,358

(22) Filed: May 13, 2009

(65) Prior Publication Data

US 2009/0284308 A1 Nov. 19, 2009

(30) Foreign Application Priority Data

May 14, 2008 (KR) .......................... 10-2008-0044478

(51) Int. Cl.
*G05F 1/575* (2006.01)
*H02M 3/00* (2006.01)
*G11C 16/30* (2006.01)

(52) U.S. Cl. .......................................... 327/535; 363/59

(58) Field of Classification Search .................. None
See application file for complete search history.

(56) References Cited

U.S. PATENT DOCUMENTS

| | | | | |
|---|---|---|---|---|
| 5,258,662 A | * | 11/1993 | Skovmand | 327/544 |
| 5,553,030 A | * | 9/1996 | Tedrow et al. | 365/226 |
| 6,359,814 B1 | * | 3/2002 | Sundaram et al. | 365/189.09 |
| 6,756,838 B1 | * | 6/2004 | Wu et al. | 327/536 |
| 6,812,775 B2 | | 11/2004 | Seo | |
| 6,891,764 B2 | * | 5/2005 | Li | 365/189.15 |
| 7,253,676 B2 | * | 8/2007 | Fukuda et al. | 327/536 |
| 2004/0066225 A1 | | 4/2004 | Seo | |

FOREIGN PATENT DOCUMENTS

| | | |
|---|---|---|
| JP | 10-50088 A | 2/1998 |
| KR | 2000-0041743 A | 7/2000 |
| KR | 10-0543318 B1 | 1/2006 |

\* cited by examiner

*Primary Examiner* — Lincoln Donovan
*Assistant Examiner* — Terry L Englund
(74) *Attorney, Agent, or Firm* — Myers Bigel Sibley & Sajovec, P.A.

(57) ABSTRACT

A voltage generation circuit includes a high voltage detector (HVD), a clock signal control unit (CSCU), an oscillator, a pumping clock control unit (PCCU), and a charge pump. The HVD compares a high voltage applied to a memory cell array with at least one reference voltage to provide at least one comparison signal. The CSCU provides a clock control signal for changing a frequency of a clock signal in response to the at least one comparison signal. The oscillator generates the clock signal having a frequency according to the clock control signal. The PCCU passes or intercepts the clock signal to provide a pumping clock signal, in response to a control signal. The charge pump consecutively performs charge pumping operations to provide the high voltage while the pumping clock signal is applied to the charge pump.

11 Claims, 6 Drawing Sheets

VOLTAGE GENERATION CIRCUIT AND FLASH MEMORY DEVICE INCLUDING THE SAME

REFERENCE TO PRIORITY APPLICATION

This application claims priority to Korean Patent Application No. 2008-44478, filed May 14, 2008, the disclosure of which is hereby incorporated herein by reference.

FIELD OF THE INVENTION

The present invention relates to semiconductor memory devices and, more particularly, to flash memory devices and methods of operating same.

BACKGROUND

Semiconductor memories are usually considered to be a vital microelectronic component of digital logic system design. For example, semiconductor memories are extensively used in devices such as computers and in microprocessor-based applications ranging from satellites to consumer electronics. In order to keep up with increasing demand for semiconductor memories, various advances have been made in the field of semiconductor memory fabrication. These advantages include, for example, enhancements in the semiconductor fabrication process, such as increase in scalability of semiconductor memories by increasing the integration density of semiconductor memories, and increase in operating speeds of semiconductor memories.

Generally, semiconductor memory devices may be categorized as volatile memory devices or non-volatile memory devices. There are some distinct differences between volatile and non-volatile memory devices. For example, volatile semiconductor memory devices lose stored data when power supplies are interrupted. The non-volatile memory devices retain stored data even when power supplies are interrupted. The non-volatile memory devices include, for example, mask read-only memories (MROMs), programmable read-only memories (PROMs), erasable programmable read-only memories (EPROMs), and electrically erasable programmable read-only memories (EEPROMs).

MROMs, PROMs, and EPROMs have a difficulty in rewriting stored data because read and write operations cannot be freely conducted by normal users. On the other hand, EEPROMs are increasingly used in system programming that requires the continuous update or auxiliary memory devices. Particularly, flash memory EEPROMs can be advantageously used as mass storage devices because their integration density is higher than conventional EEPROMs.

Flash memory devices may be classified into NOR-type flash memories (hereinafter, referred to as "NOR flash memories") and NAND-type flash memories (hereinafter, referred to as "NAND flash memories"). This classification is based on cell-bitline connection status. For example, in a NOR flash memory, at least two cell transistors are connected to a bitline in parallel. Furthermore, NOR flash memories store data by means of channel hot electron and erase data by means of F-N tunneling. In contrast, in a NAND flash memory, at least two cell transistors are connected to a bitline in series. Furthermore, NAND flash memories are disadvantageous in increasing integration density due to their high power consumption. However, NOR flash memories have the advantage of having a high operation speed. In recent years, many efforts have been made towards increasing the integration density of NOR flash memories. One of these efforts is based in the concept of multi-level cell (hereinafter referred to as "MLC").

In a case where, for example, single-bit data is stored in a flash memory, data stored in a unit cell may be expressed by two threshold voltage distributions, each corresponding to data "1" and data "0". On the other hand, in a case where two-bit data is stored in a flash memory, data stored in a unit cell may be expressed by four threshold voltage distributions, each corresponding to data "11", data "10", data "00" and data "01". As a number of bits of data stored in respective cells increases, the number of voltage levels for programming, erasing, and reading operations also increase.

Therefore, it is required to precisely generate respective voltages for programming, erasing, and reading operations in the flash memory. In addition, it is required to maintain levels of the respective voltages without being changed. It is also required to alter levels of the respective voltages actually applied to the flash memory without extra processes such as a fuse cutting and a metal option.

SUMMARY

Example embodiments provide a voltage generation circuit capable of efficiently controlling level of a high voltage applied to a memory cell array.

Example embodiments provide a flash memory device including the voltage generation circuit.

According to some example embodiments, a voltage generation circuit includes a high voltage detector (HVD), a clock signal control unit (CSCU), an oscillator, a pumping clock control unit (PCCU), and a charge pump. The HVD compares a high voltage applied to a memory cell array with at least one reference voltage to provide at least one comparison signal. The CSCU provides a clock control signal for changing a frequency of a clock signal in response to the at least one comparison signal. The oscillator generates the clock signal having a frequency according to the clock control signal. The PCCU transfers or intercepts the clock signal to provide a pumping clock signal, in response to a control signal indicating whether a level of the high voltage is higher than or equal to a reference level. The charge pump consecutively performs charge pumping operations to provide the high voltage while the pumping clock signal is applied to the charge pump.

In some embodiments, the voltage generation circuit may further include a high voltage regulator that compares a divided voltage with a first reference voltage to provide the control signal which is selectively enabled based on the comparison of the divided voltage and the first reference voltage, and the divided voltage may be obtained by dividing the high voltage using at least two dividing resistors.

In some embodiments, the voltage generation circuit may further include a trim block that provides a trim control signal for controlling the divided voltage according to trim information that is externally provided, when the level of the high voltage is required to be changed.

In some embodiments, the at least one comparison signal may include a first comparison signal and a second comparison signal, the first comparison signal may be applied to the CSCU when the level of the high voltage is higher than the level of the second reference voltage, and the frequency of the clock signal may be increased according to the clock control signal. The second comparison signal may be applied to the CSCU when the level of the high voltage is lower than the level of the second reference voltage, and the frequency of the clock signal may be decreased according to the clock control signal.

In some embodiments, the voltage regulator may include an amplifier that provides a voltage control signal in response to the first oscillation control signal, the second oscillation control signal, and the regulated voltage signal; and a transistor, coupled to a power supply voltage, which provides the regulated voltage signal in response to the voltage control signal.

According to other example embodiments, a voltage generation circuit includes a high voltage regulator, a trim block, a clock signal control unit (CSCU), an oscillator, a pumping clock control unit (PCCU), and a charge pump. The high voltage regulator compares a divided voltage with a reference voltage to provide a control signal which is selectively enabled based on the comparison of the divided voltage and the reference voltage, and the divided voltage is obtained by dividing the high voltage applied to a memory cell array. The trim block provides a trim control signal for controlling the divided voltage according to trim information, when a level of the high voltage is required to be changed, and the trim information is externally provided. The CSCU provides a clock control signal for changing a frequency of a clock signal in response to the trim control signal. The oscillator generates the clock signal having a frequency according to the clock control signal. The PCCU transfers or intercepts the clock signal to provide a pumping clock signal, in response to the control signal. The charge pump consecutively performs charge pumping operations to provide the high voltage while the pumping clock signal is applied to the charge pump.

In some embodiments, the control signal may be enabled when the level of the high voltage is higher than a level of the reference voltage, and the PCCU may intercept the clock signal when the control signal is enabled.

In some embodiments, the control signal may be disabled when the level of the high voltage is lower than a level of the reference voltage, and the PCCU may pass the clock signal when the control signal is disabled.

In some embodiments, the CSCU may control the oscillator such that the frequency of the clock signal is increased, in response to the trim control signal, when the level of the high voltage is required to be heightened.

In some embodiments, the CSCU may control the oscillator such that the frequency of the clock signal is decreased, in response to the trim control signal, when the level of the high voltage is required to be lowered.

According to still other example embodiments, a voltage generation circuit includes a high voltage detector (HVD), a high voltage regulator, a trim block, a clock signal control unit (CSCU), an oscillator, a pumping clock control unit (PCCU), and a charge pump. The HVD compares a high voltage applied to a memory cell array with at least one reference voltage to provide at least one comparison signal. The high voltage regulator compares a divided voltage with a first reference voltage to provide the control signal which is selectively enabled based on the comparison of the divided voltage and the first reference voltage, and the divided voltage is obtained by dividing the high voltage. The trim block provides a trim control signal that is externally provided, when the level of the high voltage is required to be changed. The CSCU provides a clock control signal for changing a frequency of a clock signal in response to the trim control signal, or the at least one comparison signal, or in response to the trim control signal and the at least one comparison signal. The oscillator generates the clock signal having a frequency according to the clock control signal. The PCCU transfers or intercepts the clock signal to provide a pumping clock signal, in response to the control signal indicating whether a level of the high voltage is higher than or equal to a reference level. The charge pump consecutively performs charge pumping operations to provide the high voltage while the pumping clock signal is applied to the charge pump.

In some embodiments, the CSCU may control the oscillator such that the frequency of the clock signal is increased, in response to the trim control signal, when the level of the high voltage is required to be heightened.

In some embodiments, the CSCU may control the oscillator such that the frequency of the clock signal is decreased, in response to the trim control signal, when the level of the high voltage is required to be lowered.

In some embodiments, the at least one reference voltage may include a second reference voltage and a third reference voltage, the at least one comparison signal may include a first comparison signal and a second comparison signal, the first comparison signal may be applied to the CSCU when the level of the high voltage is higher than the level of the second reference voltage, the frequency of the clock signal may be increased according to the clock control signal, and a level of the third reference voltage may be lower than the level of the second reference voltage.

In some embodiments, the second comparison signal may be applied to the CSCU when the level of the high voltage is lower than the level of the second reference voltage, and the frequency of the clock signal may be decreased according to the clock control signal.

According to some example embodiments, a flash memory device includes a memory cell array, a voltage generation circuit and a selection circuit. The memory cell array includes a plurality of memory cells. The voltage generation circuit generates a plurality of high voltages according to operation mode. The selection circuit selects one of the high voltages to provide the selected high voltage to the memory cell array. The voltage generation circuit changes levels of the high voltages according to the operation mode by changing a frequency of a clock signal for generating the high voltages based on a comparison of the levels of the high voltages with at least one reference voltage.

In some embodiments, the voltage generation circuit may include a high voltage regulator that compares a divided voltage with a first reference voltage of the at least one reference voltage to provide a control signal which is selectively enabled based on the comparison of the divided voltage and the first reference voltage, the divided voltage being obtained by dividing the high voltage; a high voltage detector (HVD) configured to compare the high voltage with a second reference voltage and a third reference voltage of the at least one reference voltage to provide a first comparison signal and a second reference signal according to the comparison of the high voltage with the second and third reference voltages; a clock signal control unit (CSCU) configured to provide a clock control signal for changing the frequency of the clock signal in response to the first and second comparison signal; an oscillator that generate the clock signal having a frequency according to the clock control signal; a pumping clock control unit (PCCU) configured to transfer or intercept the clock signal to provide a pumping clock signal, in response to the control signal; and a charge pump configured to consecutively perform charge pumping operations to provide the high voltage while the pumping clock signal is applied to the charge pump.

In some embodiments, the voltage generation circuit may include a high voltage regulator that compares a divided voltage with a first reference voltage of the at least one reference voltage to provide a control signal which is selectively enabled based on the comparison of the divided voltage and the first reference voltage, the divided voltage being obtained by dividing the high voltage; a trim block that provides a trim control signal that is externally provided, when the level of the high voltage is required to be changed; a clock signal control unit (CSCU) configured to provide a clock control signal for changing the frequency of the clock signal in response to the trim control signal; an oscillator that generate the clock signal having a frequency according to the clock control signal; a pumping clock control unit (PCCU) configured to transfer or intercept the clock signal to provide a pumping clock signal, in response to a control signal indicating whether a level of the high voltage is higher than or equal to a reference level; and a charge pump configured to consecutively perform charge pumping operations to provide the high voltage while the pumping clock signal is applied to the charge pump.

In some embodiments, the voltage generation circuit may include a high voltage detector (HVD) configured to compare the high voltage with a second reference voltage and a third reference voltage of the at least one reference voltage to provide at least one comparison signal according to the comparison of the high voltage with the second and third reference voltages; a high voltage regulator that compares a divided voltage with a first reference voltage of the at least one reference voltage to provide a control signal which is selectively enabled based on the comparison of the divided voltage and the first reference voltage, the divided voltage being obtained by dividing the high voltage; a trim block that provides a trim control signal that is externally provided, when the level of the high voltage is required to be changed; a clock signal control unit (CSCU) configured to provide a clock control signal for changing the frequency of the clock signal in response to the trim control signal, or the at least one comparison signal, or in response to the trim control signal and the at least one comparison signal; an oscillator that generate the clock signal having a frequency according to the clock control signal; a pumping clock control unit (PCCU) configured to transfer or intercept the clock signal to provide a pumping clock signal, in response to a control signal indicating whether a level of the high voltage is higher than or equal to a reference level; and a charge pump configured to consecutively perform charge pumping operations to provide the high voltage while the pumping clock signal is applied to the charge pump.

Accordingly, it is possible to precisely generate respective voltage for programming, erasing, and reading the respective data, and to alter levels of the respective voltages actually applied to the flash memory without extra processes such as a fuse cutting and a metal option such that efficiency is enhanced and test time is reduced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
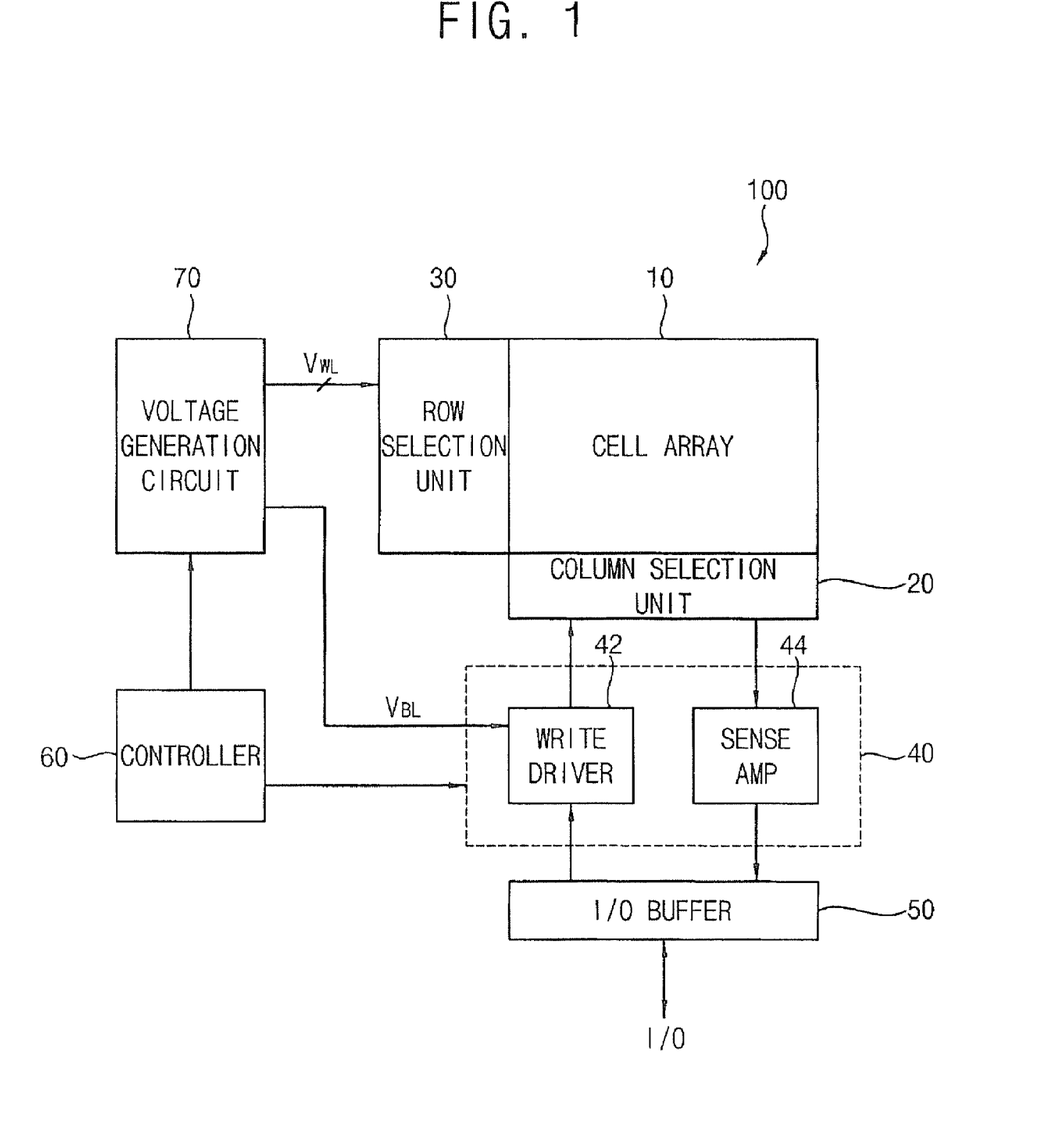
FIG. 1 is a block diagram illustrating a flash memory device according to some example embodiments.

FIG. 1 is a block diagram illustrating a flash memory device according to some example embodiments. In some example embodiments, a flash memory device 100 in FIG. 1 may be a NOR flash memory device adopting MLC data storage.

Referring to FIG. 1, the flash memory device 100 includes a memory cell array 10, a column selection unit 20, a row selection unit 30, a data input/output circuit 40, an input/output buffer 50, a controller 60, and a voltage generation circuit 70.

Referring to FIG. 1, the memory cell array 10 includes a plurality of memory cells arranged at intersections of rows (i.e., wordlines) and columns (i.e., bitlines). The voltage generation circuit 70 generates a plurality of high voltages required for programming, erasing, and reading operations. The high voltages generated from the voltage generation circuit 70 are applied to corresponding wordlines through the row selection unit 30. The row selection unit 30 selects one of the high voltages generated from the voltage generation circuit 70 and applies the selected voltage to the corresponding wordline. In addition, the column selection unit 20 selects a bitline to which a cell to be programmed (or read) is connected, from amongst a plurality of memory cells included in a selected wordline.

The input/output buffer 50 buffers data to be programmed into the memory cell array 10 and data sensed from the memory cell array 10. The data input/output circuit 40 includes a write driver 42 and a sense amplifier 44. The write driver 42 receives data to be programmed from the input/output buffer 50 for programming a selected memory cell. The data sensed by the sense amplifier 44 is stored in the input/output buffer 50. The controller 60 controls general operations associated with program, erase, and read operations of a flash memory.

Hereinafter, for the convenience of description, configuration and operation of the voltage generation circuit 70 will be described in detail below.

Figure 2:
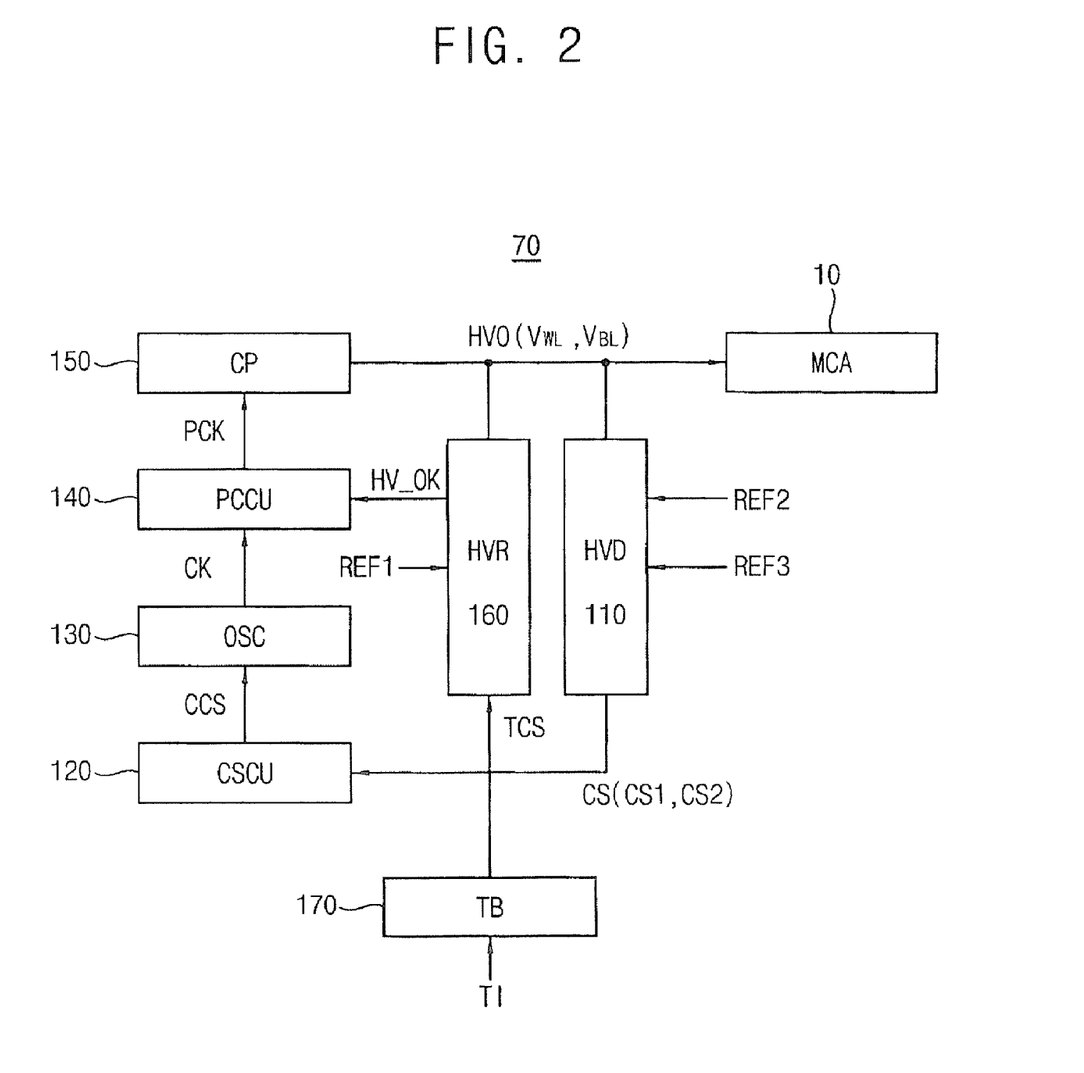
FIG. 2 is block diagram illustrating a voltage generation circuit according to an example embodiment.

FIG. 2 is block diagram illustrating a voltage generation circuit according to an example embodiment.

Referring to FIG. 2, a voltage generation circuit 70 includes a high voltage detector (HVD) 110, a clock signal control unit (CSCU) 120, an oscillator 130, a pumping clock control unit (PCCU) 140, and a charge pump 150. The voltage generation circuit 70 may further include a high voltage regulator (HVR) 160 and a trim block 170.

The HVD 110 compares a high voltage HVO applied to the memory cell array 10 with at least one reference voltage, and provides at least one comparison signal CS. Here, the high voltage HVO may include word line voltages $V_{WL}$ and bitline voltages $V_{BL}$. In addition, the at least one reference voltage may include a second reference voltage REF2 and a third reference voltage REF3. The at least one comparison signal CS may include a first comparison signal CS1 and a second comparison signal CS2. The CSCU 120 provides a clock control signal CCS for changing a frequency of a clock signal CK in response to the at least one comparison signal CS. The PCCU 140 transfers or intercepts the clock signal CK to provide a pumping clock signal PCK, in response to a control signal HV_OK from the HVR 160. The charge pump 150 consecutively performs pumping operations to provide the high voltage HVO while the pumping clock signal PCK is applied to the charge pump 150.

Figure 3:
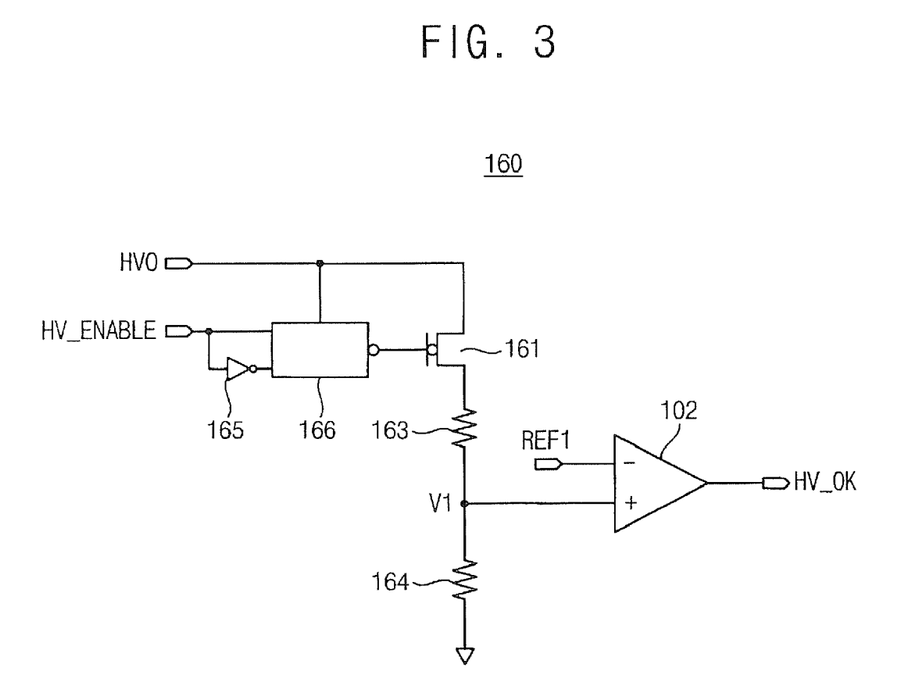
FIG. 3 is a block diagram illustrating a HVR of FIG. 2 according to an example embodiment.

FIG. 3 is a block diagram illustrating a HVR of FIG. 2 according to an example embodiment.

Referring to FIG. 3, a HVR 160 includes a p-type metal oxide semiconductor (PMOS) transistor 161, a first dividing resistor 163, a second dividing resistor 164, a first comparator 102, an inverter 165 and a level shifter 166.

The HVR 160 turns on/off the PMOS transistor 161 according to a logic level of a high voltage enable signal HV_ENABLE that follows the level of the high voltage HVO. The first comparator 102 compares a first divided voltage V1 with the first reference voltage REF1 to provide the control signal HV_OK that transitions to a logic high level when the level of the first divided voltage V1 is higher than or equal to a reference level, for example, the level of the first reference voltage REF1. Here, the first divided voltage V1 may be obtained using the high voltage HVO with the first and second dividing resistors 163 and 164.

Figure 4:
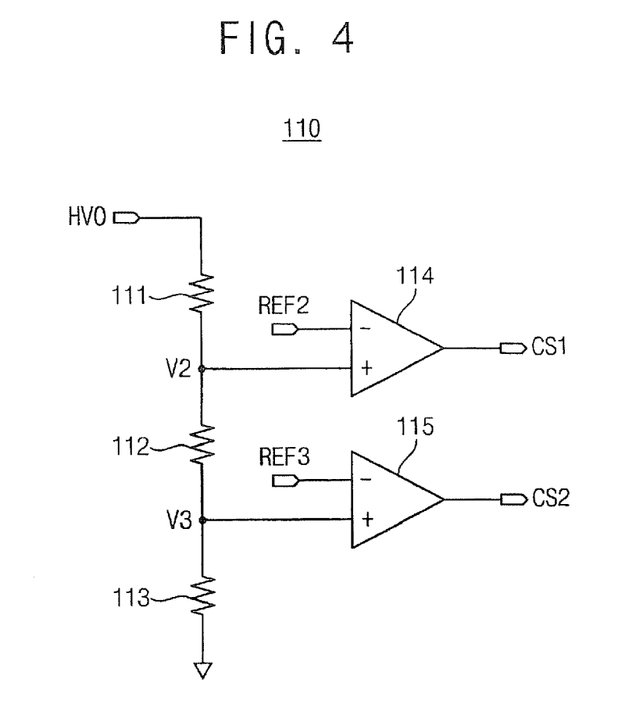
FIG. 4 is a block diagram illustrating a HVD of FIG. 2 according to an example embodiment.

FIG. 4 is a block diagram illustrating a HVD of FIG. 2 according to an example embodiment.

Referring to FIG. 4, a HVD 110 includes first through third dividing resistors 111, 112, and 113, a second comparator 114, and a third comparator 115. The HVD 110 compares the high voltage HVO with second and third reference voltages REF2 and REF3 to provide the first comparison signal CS1 and the second comparison signal CS2 based on the comparison result. More particularly, the high voltage HVO is divided into a second divided voltage V2 and a third divided voltage V3 using the first through third dividing resistors 111, 112, and 113. The second comparator 114 compares the second divided voltage V2 with the second reference voltage REF2 to provide the first comparison signal CS1 having a logic level according to the comparison result. The third comparator 115 compares the third divided voltage V3 with the second reference voltage REF3 to provide the second comparison signal CS2 having a logic level according to the comparison result.

The HVD 110 may provide respectively the first comparison signal CS1 and the second comparison signal CS2, each having a single bit. Alternatively, the HVD 110 may provide a two-bit comparison signal CS including the first comparison signal CS1 and the second comparison signal CS2. When the HVD 110 provides the two-bit comparison signal CS and the level of the second divided voltage V2 is higher than or equal to the level of the second reference voltage REF2, the comparison signal CS may be "11". When the level of the second divided voltage V2 is lower than the second reference voltage REF2, and the level of the third divided voltage V3 is higher than or equal to the third reference voltage REF3, the comparison signal CS may be "01". When the level of the third divided voltage V3 is lower than or equal to the level of the third reference voltage REF3, the comparison signal CS may be "00". Alternatively, the comparison signal CS may include more than three bits according to a number of dividing resistors included in the HVD 110.

Hereinafter, referring to FIGS. 2 through 4, there will be description about operations of the voltage generation circuit.

When the level of the high voltage HVO applied to the memory cell array 10 (particularly, the level of the first divided voltage V1) is higher than or equal to the level of first reference voltage REF1, the control signal HV_OK provided from the HVR 160 transitions to a logic high level. When the control signal HV_OK is a logic high level, the PCCU 140 intercepts the clock signal CK provided from the oscillator 130. That is, when the control signal HV_OK is a logic high level, the pumping clock signal PCK is not applied to charge pump 150. Since the pumping clock signal PCK is not applied to charge pump 150, the level of the high voltage HVO applied to the memory cell array 10 is maintained at a regular level.

The level of the high voltage HVO applied to the memory cell array 10 is detected by the HVD 110 based on the second reference voltage REF2 and the third reference voltage REF3. When the level of the high voltage HVO is higher than or equal to the level of second reference voltage REF2, the first comparison signal CS1 from the first comparator 114 transitions to a logic high level. When the first comparison signal CS1 of logic high level is applied to the CSCU 120, the CSCU 120 provides the clock control signal CCS for decreasing the frequency of the clock signal CK to the oscillator 130 in response to the first comparison signal CS1 of logic high level. The oscillator 130 provides the clock signal CK having a decreased frequency to the PCCU 140, and simultaneously the pumping clock signal PCK having a decreased frequency is applied to or intercepted from the charge pump 150 according to the logic level of the control signal HV_OK. When resistances of the first and second divided resistors 163 and 164 of the HVR 160 and resistances of the third to fifth divided resistors 111, 112, and 113 are all equal with respect to one another, the level of the first divided voltage V1 is lower than the level of the second divided voltage V2, and the control signal HV_OK corresponds to logic high level. Therefore, the pumping clock signal PCK is not applied to the charge pump 150, and thus the level of the high voltage HVO is lowered.

When the programming reading and erasing operations to the memory cell array 10 are performed, the level of the high voltage HVO continues to be lowered. When the level of the high voltage is lower than the level of third reference voltage REF3, the second comparison signal CS2 transitions to logic low level. When the second comparison signal CS2 of logic low level is applied to the CSCU 120, the CSCU 120 provides the clock control signal CCS for increasing the frequency of the clock signal CK to the oscillator 130 in response to the second comparison signal CS2 of logic low level. The oscillator 130 provides the clock signal CK having an increased frequency to the PCCU 140, and simultaneously the pumping clock signal PCK having an increased frequency is applied to or intercepted from the charge pump 150 according to the logic level of the control signal HV_OK. When resistances of the first and second dividing resistors 163 and 164 of the HVR 160 and resistances of the third to fifth dividing resistors 111, 112, and 113 are all equal with respect to one another, the level of the first divided voltage V1 is higher than the level of the third divided voltage V3, and the control signal HV_OK corresponds to logic low level. Therefore, the pumping clock signal PCK is applied to the charge pump 150. The charge pump 150 consecutively performs charge pump operation, and thus the level of the high voltage HVO is heightened.

As described above, the frequency of the clock signal CK generated from the oscillator 130 may be controlled by clock control signal CCS, because capacitors (not illustrated) in the oscillator 130 are connected or disconnected in response to the clock control signal CCS, and thus time constant of the oscillator 130 may be controlled.

Levels of the first through third reference voltages REF1, REF2, and REF3 may be varied according to various example embodiments, and resistances of the first and second dividing resistors 163 and 164 of the HVR 160 and resistances of the third to fifth dividing resistors 111, 112, and 113 may be varied according to various example embodiments.

The initially-set level of the high voltage HVO may be changed due to procedure variations, and it is sometimes required to set the level of the high voltage HVO applied to the memory cell array 10 to another level other than the initially-set level. In these cases, desired levels of the high voltage HVO may be obtained by applying the trim control signal TCS from the trim block 170 to the HVR 160 to change resistance ratio of the dividing resistors 163 and 164. The trim block 170 stores trim information TI that is externally provided, and applies the trim control signal TCS to the HVR 160 based on the stored trim information TI.

Figure 5:
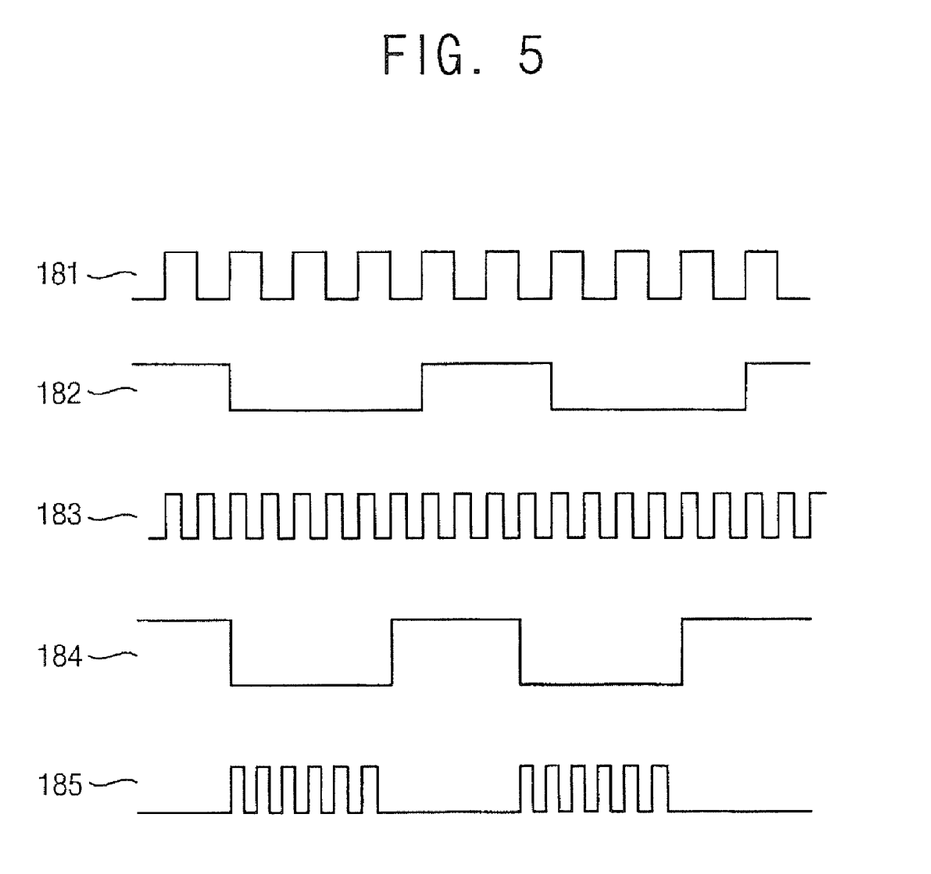
FIG. 5 is a timing diagram illustrating various signals of the voltage generation circuit.

FIG. 5 is a timing diagram illustrating various signals of the voltage generation circuit. In FIG. 5, reference numeral 181 illustrates the clock signal CK, whose frequency is not changed, generated from the oscillator 130. The reference numeral 182 illustrates the control signal HV_OK generated from the HVR 160. The reference numeral 183 the clock signal CK, whose frequency is increased, generated from the oscillator 130. The reference numeral 184 illustrates the control signal HV_OK applied to the PCCU 140 when the frequency of the clock signal CK is increased. The reference numeral 185 illustrates the pumping clock signal PCK applied to the charge pump 150 when the frequency of the clock signal CK is increased.

Referring to FIG. 5, as described with reference to FIGS. 2 through 4, the frequency of the clock signal CK may be increased according to the level of the high voltage HVO. The frequency of the clock signal CK may be increased when the level of the high voltage HVO is higher than a predetermined level.

The frequency of the clock signal CK may be changed by the trim control signal TCS generated from the trim block 170 as well as the comparison signal CS of the HVD 110.

Figure 6:
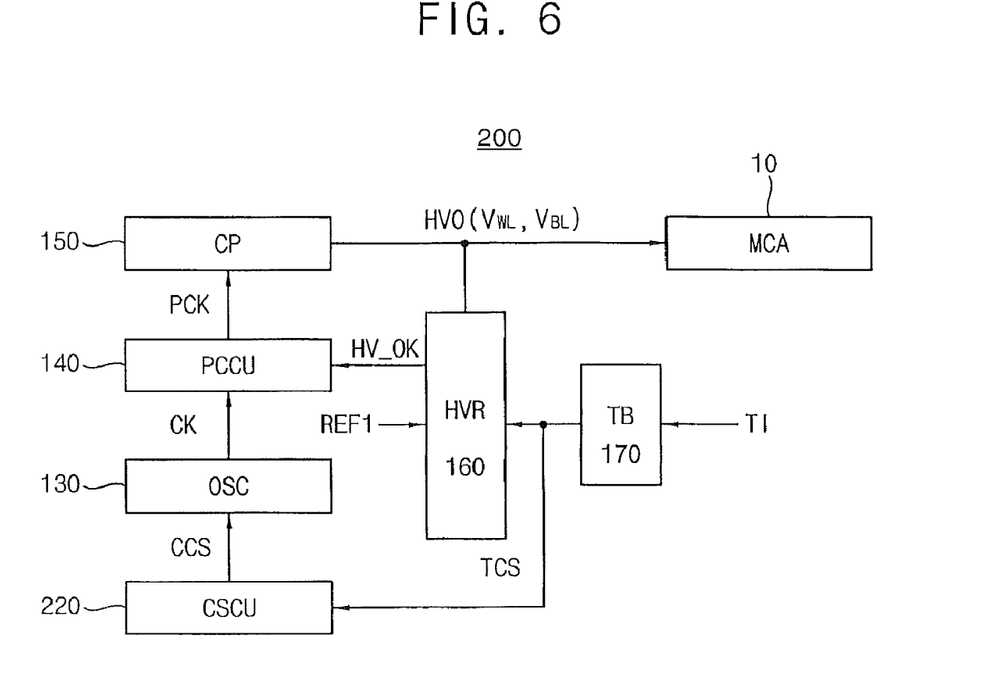
FIG. 6 is a block diagram illustrating a voltage generation circuit of FIG. 1 according to another example embodiment.

FIG. 6 is a block diagram illustrating a voltage generation circuit of FIG. 1 according to another example embodiment. Referring to FIG. 6, a voltage generation circuit 200 according to another example embodiment includes a CSCU 220, an oscillator 130, a PCCU 140, a charge pump 150, a HVR 160 and a trim block 170. The voltage generation circuit 200 of FIG. 6 differs from the voltage generation circuit 70 of FIG. 2 in that the voltage generation circuit 200 of FIG. 6 does not include the HVD 110, and the trim control signal TCS is applied to the CSCU 220 as well as to the HVR 160.

Hereinafter, referring to FIGS. 3 and 6, there will be description about the voltage generation circuit 200. The trim block 170 applies the trim control signal TCS to the HVR 160 and the CSCU 220 based on the trim information TI that is externally provided. The HVR changes resistance ratio of the first and second dividing resistors 163 and 164 to change the level of the first divided voltage V1. The CSCU 220 receives the trim control signal TCS from the trim block 170, and applies the clock control signal CCS to the oscillator 130 according to the trim control signal TCS. The trim control signal TCS may include information for changing the resistance ratio of the first and second dividing resistors 163 and 164 and include more than two bits because the trim control signal TCS is based on trim information TI that is externally provided. Accordingly, the CSCU 220 provides the clock control signal CCS to the oscillator 130 according to the logic level of each bit of the trim control signal TCS. The oscillator 130 generates the clock signal CK whose frequency is increased or decreased in response to the clock control signal CCS to provide the generated clock signal CK to the PCCU 140. The PCCU 140 transfers or intercepts the clock signal CK, whose frequency is changed, to provide the pumping clock signal PCK to the charge pump 150 in response to the logic level of the control signal HV_OK whose logic level is determined based on comparison of the changed level of first divided voltage V1 with the level of the first reference voltage REF1. The charge pump 150 heightens or lowers the level of the high voltage HVO in response to the pumping clock signal PCK.

As described above with reference to FIGS. 2 through 5, the frequency of the clock signal CK generated from the oscillator 130 may be controlled by clock control signal CCS, because capacitors (not illustrated) in the oscillator 130 are connected or disconnected in response to the clock control signal CCS, and thus time constant of the oscillator 130 may be controlled.

Figure 7:
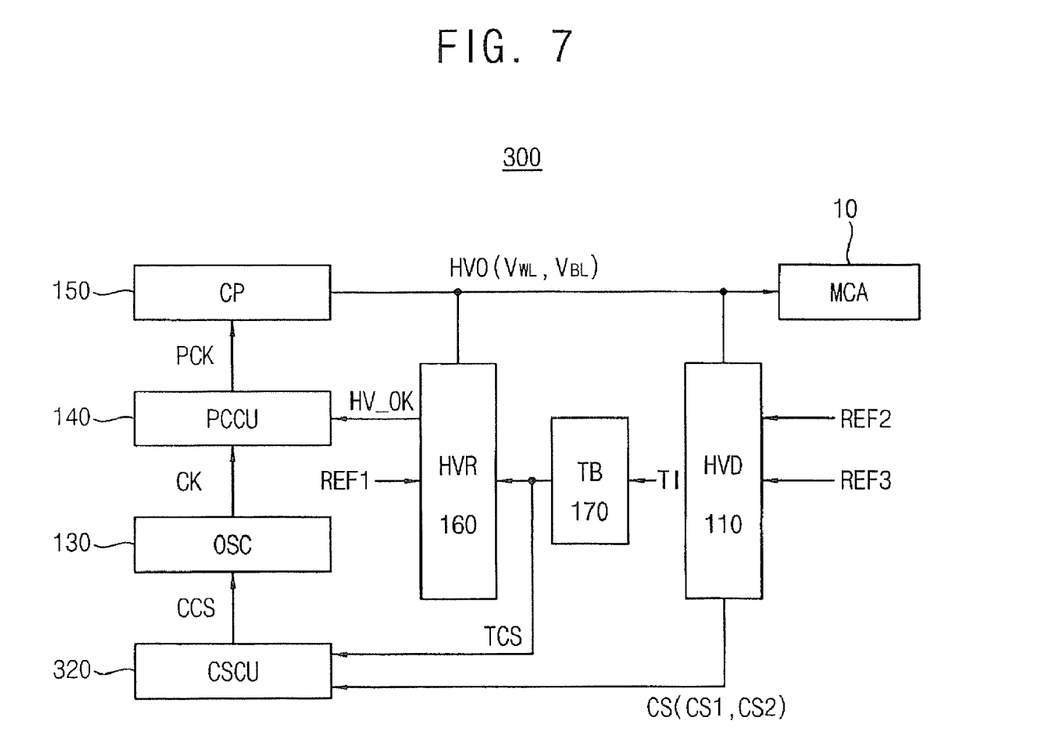
FIG. 7 is a block diagram illustrating a voltage generation circuit of FIG. 1 according to still another example embodiment.

FIG. 7 is a block diagram illustrating a voltage generation circuit of FIG. 1 according to still another example embodiment. Referring to FIG. 7, a voltage generation circuit 300 according to still another example embodiment includes a HVD 110, a CSCU 320, an oscillator 130, a PCCU 140, a charge pump 150, a HVR 160 and a trim block 170. The voltage generation circuit 300 of FIG. 7 differs from the voltage generation circuit 70 of FIG. 2 in that the HVD 100 and the trim block respectively provide the comparison signal CS and the trim control signal TCS to the CSCU 320. In addition, the voltage generation circuit 300 of FIG. 7 differs from the voltage generation circuit 200 of FIG. 6 in that the voltage generation circuit 300 includes the HVD 100 and provides the comparison signal CS to the CSCU 320.

Hereinafter, referring to FIGS. 3, 4 and 7, there will be description about the voltage generation circuit 300. The trim block 170 applies the trim control signal TCS to the HVR 160 and the CSCU 320 based on the trim information TI that is externally provided. The HVR changes the resistance ratio of the first and second dividing resistors 163 and 164 to change the level of the first divided voltage V1. The CSCU 320 receives the trim control signal TCS from the trim block 170, and applies the clock control signal CCS to the oscillator 130 according to the trim control signal TCS. The trim control signal TCS may include information for changing the resistance ratio of the first and second dividing resistors 163 and 164 and include more than two bits because the trim control signal TCS is based on trim information TI that is externally provided. Accordingly, the CSCU 320 provides the clock control signal CCS to the oscillator 130 according to the logic level of each bit of the trim control signal TCS. The oscillator 130 generates the clock signal CK whose frequency is increased or decreased in response to the clock control signal CCS to provide the generated clock signal CK to the PCCU 140. The PCCU 140 transfers or intercepts the clock signal CK, whose frequency is changed, to provide the pumping clock signal PCK to the charge pump 150 in response to the logic level of the control signal HV_OK whose logic level is determined based on comparison of the changed level of first divided voltage V1 with the level of the first reference voltage REF1. The charge pump 150 heightens or lowers the level of the high voltage HVO in response to the pumping clock signal PCK.

The HVD 110 compares the high voltage HVO with the second and third reference voltages REF2 and REF3 to provide the first comparison signal CS1 and the second comparison signal CS2 based on the comparison result. The first and second comparison signals CS1 and CS2 are applied to the CSCU 320. Accordingly, the CSCU 320 provides the clock control signal CCS to the oscillator 130 according to the logic level of each bit of the first and second comparison signals CS1 and CS2. The oscillator 130 generates the clock signal CK whose frequency is increased or decreased in response to the clock control signal CCS to provide the generated clock signal CK to the PCCU 140. The PCCU 140 transfers or intercepts the clock signal CK, whose frequency is changed, to provide the pumping clock signal PCK to the charge pump 150 in response to the logic level of the control signal HV_OK whose logic level is determined based on the comparison of the changed level of first divided voltage V1 with the level of the first reference voltage REF1. The charge pump 150 heightens or lowers the level of the high voltage HVO in response to the pumping clock signal PCK.

Accordingly, the voltage generation circuit 300 may control the frequency of the clock signal CK respectively by using the comparison signal from the HVD 110 and the trim control signal TCS from the trim block 170. In this case, the trim control signal TCS may be used for coarsely controlling the frequency of the clock signal CK, for example, lowering or heightening the initially set level of the high voltage HVO greatly. In addition, the comparison signal CS including the first and second comparison signal CS1 and CS2 may be used for finely controlling the frequency of the clock signal CK, for example, lowering or heightening the initially set level of the high voltage HVO narrowly. Of course, the level of the high voltage HVO may be changed to a desired level by using both the trim control signal TCS and the comparison signal CS.

As described above with reference to FIGS. 2 through 5, the frequency of the clock signal CK generated from the oscillator 130 may be controlled by clock control signal CCS, because capacitors (not illustrated) in the oscillator 130 are connected or disconnected in response to the clock control signal CCS, and thus time constant of the oscillator 130 may be controlled.

Figure 8:
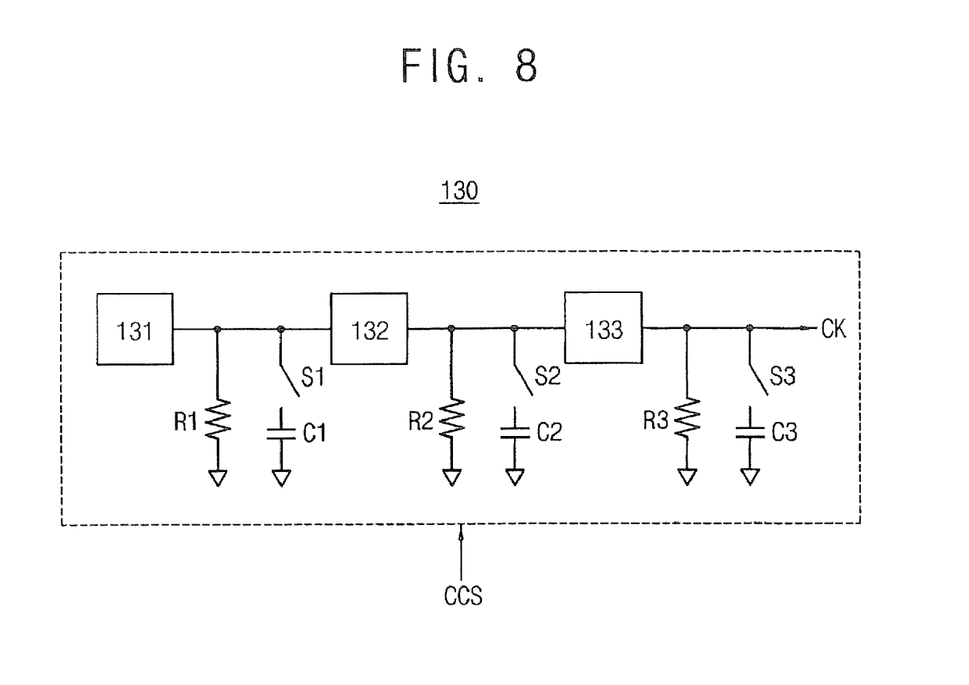
FIG. 8 illustrates an oscillator 130 according to an example embodiment.

FIG. 8 illustrates an oscillator 130 according to an example embodiment.

Referring to FIG. 8, the oscillator 130 includes a plurality of delay elements 131, 132, and 133, a plurality of resistors R1, R2, and R3, a plurality of capacitors C1, C2, and C3 and a plurality of switches S1, S2, and S3. The plurality of capacitors C1, C2, and C3 are selectively connected by the switches S1, S2, and S3 in response to the clock control signal CCS which is selectively enabled based on the comparison signal CS, the trim control signal TCS or the comparison signal CS and the trim control signal TCS which is/are applied to the CSCU 320, and thus the frequency of the clock may be changed by the time constant of the oscillator 130, which is changed according to a number of the capacitors C1, C2, and C3 that are connected.

Even though various example embodiments have been described with reference to the NOR type flash memory device, it is understood to those skilled in the art that the various example embodiments can be adaptable to an arbitrary non-volatile memory device such as NAND type flash memory devices, MROMs, PROMs, EPROMs, and EEPROMs in which a voltage generation circuit which generates a plurality of stable high voltages is required.

As mentioned above, the example embodiments are applicable to the non volatile memory devises which need high voltages, because it is possible to precisely generate respective voltage for programming, erasing, and reading the respective data, and to alter levels of the respective voltages actually applied to the flash memory without extra processes such as a fuse cutting and a metal option such that efficiency is enhanced and test time is reduced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. An integrated circuit device, comprising:
  a voltage detector configured to generate at least one comparison signal in response to a boosted voltage signal;
  a clock generator configured to generate a clock signal having a variable frequency, in response to the at least one comparison signal, said clock generator comprising:

a clock signal control unit configured to generate a clock control signal in response to the at least one comparison signal; and an oscillator responsive to the clock control signal, said oscillator configured to generate the clock signal at a frequency determined by a value of the clock control signal; and a charge pump circuit configured to generate the boosted voltage signal in response to the clock signal, said charge pump circuit comprising:

a pumping clock control unit configured to selectively generate a pump clock signal in response to the clock signal and a clock transfer control signal; and a charge pump configured to generate the boosted voltage signal in response to the pump clock signal.

2. The device of claim 1, further comprising a voltage regulator configured to generate the clock transfer control signal in response to the boosted voltage signal.

3. The device of claim 2, wherein said pumping clock control unit is configured to pass the clock signal as the pump clock signal when the clock transfer control signal has a first logic state, but suspend generation of the pump clock signal when the clock transfer control signal has a second logic state, opposite the first logic state.

4. The device of claim 3, wherein said voltage regulator comprises a first comparator configured to generate the clock transfer control signal, said first comparator having a first input terminal responsive to a first reference voltage.

5. The device of claim 4, wherein said voltage detector comprises a second comparator configured to generate a first one of the at least one comparison signal, said second comparator having a first input terminal responsive to a second reference voltage.

6. The device of claim 5, wherein said voltage detector further comprises a first voltage divider having a first node responsive to the boosted voltage signal and a second node electrically connected to a second input terminal of said second comparator.

7. The device of claim 2, further comprising a trim circuit configured to generate a trim control signal in response to trim information; and wherein said voltage regulator is configured to respond to changes in the trim control signal by adjusting a set point therein for controlling switching of the clock transfer control signal in response to changes in the boosted voltage signal.

8. The device of claim 7, wherein said clock signal control unit is further responsive to the trim control signal.

9. A voltage generation circuit, comprising:

a high voltage detector (HVD) configured to compare a high voltage, applied to a memory cell array, with at least a first reference voltage to provide at least one comparison signal;

a clock signal control unit (CSCU) configured to provide a clock control signal for changing a frequency of a clock signal in response to the at least one comparison signal;

an oscillator that generates the clock signal having a frequency according to the clock control signal;

a pumping clock control unit (PCCU) configured to transfer or intercept the clock signal to provide a pumping clock signal, in response to a control signal indicating whether a level of the high voltage is higher than or equal to a threshold voltage level; and a charge pump configured to consecutively perform pumping operations to provide the high voltage while the pumping clock signal is applied to the charge pump.

10. The voltage generation circuit of claim 9, further comprising:

a high voltage regulator that compares a divided voltage having a magnitude less than the high voltage with a second reference voltage to provide the control signal which is selectively enabled based on the comparison of the divided voltage and the second reference voltage, the divided voltage being obtained by dividing the high voltage using at least two dividing resistors.

11. The voltage generation circuit of claim 10, further comprising:

a trim block that provides a trim control signal for controlling the divided voltage according to a trim information when the level of the high voltage is required to be changed, the trim information being externally provided.

* * * * *